United States Patent [19]
Cho

[11] Patent Number: 5,837,562
[45] Date of Patent: Nov. 17, 1998

[54] PROCESS FOR BONDING A SHELL TO A SUBSTRATE FOR PACKAGING A SEMICONDUCTOR

[75] Inventor: Steve T. Cho, Newport Beach, Calif.

[73] Assignee: The Charles Stark Draper Laboratory, Inc., Cambridge, Mass.

[21] Appl. No.: 499,411

[22] Filed: Jul. 7, 1995

[51] Int. Cl.[6] .............................. H01L 21/60; H01L 21/48
[52] U.S. Cl. .............................. 438/51; 438/88; 438/118; 438/125; 438/456; 438/466; 438/611; 438/654; 438/656; 438/661
[58] Field of Search ................................. 257/704, 682, 257/698; 437/210, 215, 218, 7; 438/51, 88, 118, 125, 456, 466, 611, 654, 656, 661, 685, 686, 761

[56] References Cited

U.S. PATENT DOCUMENTS

| | | | |
|---|---|---|---|
| 3,721,584 | 3/1973 | Diem | 117/212 |
| 4,079,508 | 3/1978 | Nunn | 29/580 |
| 4,266,156 | 5/1981 | Kizaki | 310/344 |
| 4,366,342 | 12/1982 | Breedlove | 174/52 FP |
| 4,516,148 | 5/1985 | Barth | 357/68 |
| 4,574,263 | 3/1986 | Liddiard | 338/18 |
| 4,574,327 | 3/1986 | Wilner | 361/283 |
| 4,682,270 | 7/1987 | Whitehead et al. | 361/401 |
| 5,047,369 | 9/1991 | Fleming et al. | 437/240 |
| 5,177,595 | 1/1993 | Beatty | 257/727 |
| 5,233,874 | 8/1993 | Putty et al. | 73/517 |
| 5,261,157 | 11/1993 | Chang | 29/844 |
| 5,293,511 | 3/1994 | Poradish et al. | 257/704 |
| 5,406,108 | 4/1995 | Inada | 257/698 |
| 5,532,187 | 7/1996 | Schreiber-Prillwitz et al. | 437/182 |

FOREIGN PATENT DOCUMENTS

| | | | |
|---|---|---|---|
| 8203727 | 8/1982 | WIPO | 437/215 |

OTHER PUBLICATIONS

K. Minami, "Cavity Pressure Control for Critical Damping of Packaged Micro Mechanical Devices", The 8th International Conference on Solid–State Sensors and Actuators, and Eurosensors IX, Sweden, pp. 240–243, Jun. 25, 1995.

*Primary Examiner*—David Graybill
*Attorney, Agent, or Firm*—Weingarten, Schurgin, Gagnebin & Hayes LLP

[57] ABSTRACT

A process for manufacturing a vacuum enclosure for a semiconductor device formed on a substrate with leads extending peripherally. Assembly of the enclosure is compatible with known batch fabrication techniques and is carried out at pressures required for optimal device operation. In a first embodiment, an intrinsic silicon shell is sealed to the substrate via electrostatic or anodic bonding with the leads diffusing into the shell. In a second embodiment, a thin interface layer of silicon or polysilicon is deposited on the substrate prior to electrostatic bonding a glass shell thereon. In a third embodiment, tunnels are formed between a lower peripheral edge of the shell and the substrate, allowing leads to pass thereunder. The tunnels are sealed by a dielectric material applied over the enclosure.

11 Claims, 6 Drawing Sheets

PROCESS FOR BONDING A SHELL TO A SUBSTRATE FOR PACKAGING A SEMICONDUCTOR

FIELD OF THE INVENTION

The present invention relates to on-chip vacuum packages, and in particular to on-chip vacuum packages compatible with micromechanical device fabrication methods.

BACKGROUND OF THE INVENTION

For many types of devices, including micromechanical devices, there is a need to provide hermetic packaging. In particular, the delicate device structures of micromechanical devices need to be enclosed for physical protection of the structures or to provide an optimal operating environment. Such optimal environments frequently require significantly lower pressure than the ambient.

In general, known vacuum enclosures have suffered from being relatively large, heavy and expensive to fabricate. Further, methods for creating such known enclosures are not compatible with batch fabrication techniques, frequently provide insufficient vacuum sealing, and degrade electrical signals conducted proximate the enclosure. Known methods of bulk vacuum packaging on a micromechanical scale are typically based on sealing enclosures with metal, ceramic, glass or other materials under vacuum conditions by mechanical sealing, solder, laser annealing, or thermic sealing techniques.

Heretofore, silicon enclosures disposed on silicon substrates and enclosing microelectronic or micromechanical devices have introduced problems with parasitic capacitance within the enclosure, interfering with electrical signals conducted on metallic conductors disposed at the silicon-silicon boundary. This is so even when tunnels are formed at this boundary to avoid direct contact between the silicon shell and the metallic conductors.

It is theoretically possible to avoid this capacitance problem by employing a micromechanical device encapsulated within a glass enclosure and a glass substrate. However, glass cannot be electrostatically bonded directly to glass. One prior art reference has attempted to take advantage of this resolution to the parasitic capacitance problem by describing the following structure. Metal leads are formed on a glass substrate, and an insulating layer is deposited on the leads. Next, a metallized layer is deposited over the insulating layer, followed by a heat fusible layer, such as of solder. After placement of an enclosure on the fusible layer, the entire package is heated to seal the device therein. The number and complexity of deposition and etching steps makes this structure unattractive from an economic and efficiency standpoint.

Enclosures are known which require a vacuum within an interior device region in order to draw enclosure elements into position. Such structures are necessarily complicated by the requirement of providing a source of vacuum to the interior only of such an enclosure. Providing a vacuum both within and without such an enclosure would negate the tendency to draw the enclosure elements inward.

It is thus desirable to provide an enclosure having a minimum number of assembly steps, which does not suffer from appreciable parasitic capacitance, and which can be efficiently assembled by batch fabrication techniques under low pressure conditions necessary for the proper functioning of the micromechanical device encapsulated therein.

SUMMARY OF THE INVENTION

The present invention includes a vacuum enclosure for a structure such as a micromechanical transducer or other device formed on a substrate with leads extending peripherally. Attachment of a shell to the substrate is compatible with known batch fabrication techniques and is carried out at low pressures required for optimal transducer operation.

A glass substrate is provided with the device to be enclosed formed thereon. Also provided is a shell defining a cavity in a lower surface thereof. In a first embodiment, the shell is formed of intrinsic silicon, thus enabling the sealing of the shell to the substrate via electrostatic or anodic bonding with the leads diffusing into the shell.

In a second embodiment, the shell is formed of glass, thus posing the problem of bonding two glass structures. In order to promote adhesion, a thin interface layer of intrinsic silicon or polysilicon is deposited on the substrate prior to attachment of the enclosure. The enclosure is then electrostatically bonded to the substrate, providing an irreversible hermetic seal without materials which outgas over time as found in known sealing techniques.

In a third embodiment, tunnels are formed between a lower peripheral edge of the shell and the substrate, allowing electrically conductive leads to pass thereunder. The tunnels are sealed by application of a dielectric material over at least the lower portion of the enclosure, thus inhibiting parasitic capacitance and sealing extremely low pressure within the enclosure without the need for sophisticated vacuum sealing equipment. Electrical connection pads are exposed proximate the enclosure by etching excess interface material away, if necessary.

In order to obtain a stable vacuum over several years, the materials inside the package in each of the foregoing embodiments are preferably outgassed. By applying a bias across the materials under high temperature and low vacuum, outgassing is accelerated.

BRIEF DESCRIPTION OF THE DRAWINGS

These and other features of the present invention are more fully set forth below in the fully exemplary detailed description and accompanying drawings of which.

DETAILED DESCRIPTION

Figure 1:
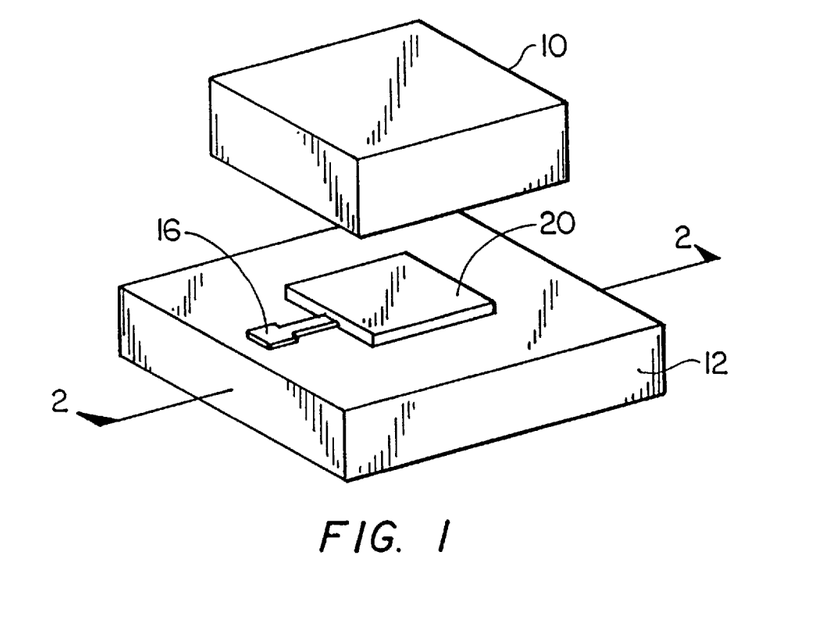
FIG. 1 is a partially exploded perspective view of an on-chip package according to the present invention disposed on a substrate.

The present invention, illustrated in an exemplary embodiment in FIG. 1, provides a vacuum shell 10 for a semiconductor device 20 such as a micromechanical gyroscope, accelerometer or other transducer formed or installed on a substrate 12 as shown in FIG. 1. The size of the shell 10 with respect to the substrate 12 is not drawn to scale. Further, the device 20 is illustrated as a generic block, and may in practice comprise several discrete elements. Finally, the thickness and surface area of the substrate 12 is not drawn to scale relative to the shell 10 or the device 20.

Figure 2:
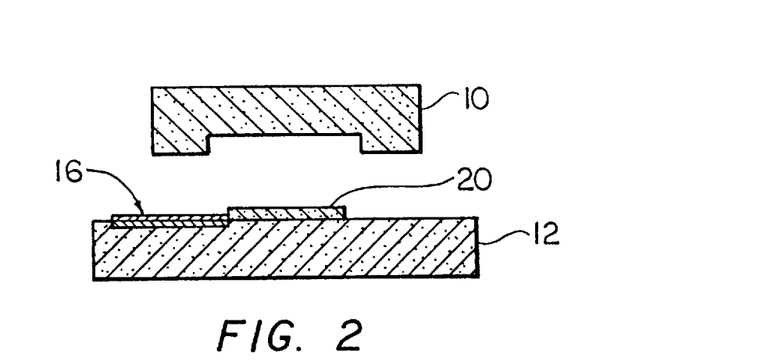
FIG. 2 is a cross-sectional side view of the on-chip vacuum package of FIG. 1 taken along lines 2—2.

The shell 10 in this first illustrated embodiment is comprised of intrinsically doped silicon or polysilicon, while the base is formed of glass (either PYREX™ or quartz). As shown in FIG. 2, an electrically conductive lead or leads 16 extend from the device 20 across the substrate 12 to a point beyond the projection of the shell 10, such that external electrical connections can be established to the device 20. An actual embodiment has a plurality of leads 16 extending from the device(s) encapsulated within the shell 10 either in the region of 16 or distributed thereabout. Other active or passive devices may be disposed on or in the substrate 12, such that at least some leads 16 conduct directly between these devices.

Figure 3:
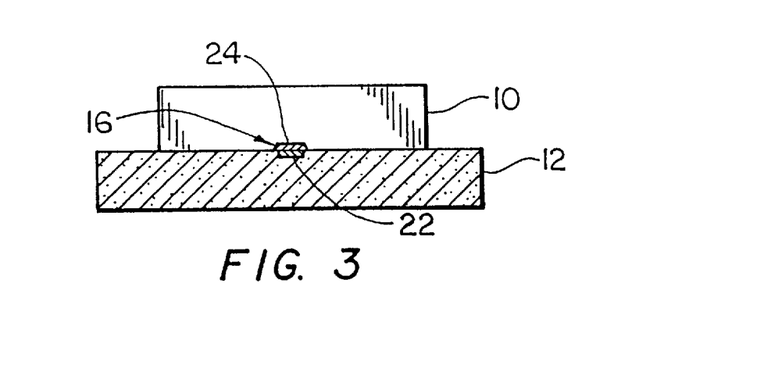
FIG. 3 is a cross-sectional side view of the on-chip vacuum package of FIG. 1 taken along lines 3—3.

In order to promote better adhesion of the leads 16 to the substrate 12, the leads 16 in one embodiment are formed of multi-metal depositions, including a thin adhesion promoting layer 22 deposited on the glass substrate 12 first, as shown in FIG. 3. In an illustrative embodiment, this adhesion promoting layer 22 is 200 Å thick and is formed of a refractory metal. Specific, non-exclusive examples include chrome, titanium, platinum, titanium-tungsten, and titanium-tungsten/palladium.

A top metal layer 24 for the multi-metal electrically conductive leads 16 is relatively soft and thick. In another illustrative embodiment, a layer of 1000 Å gold or indium is employed, with thicker layers also being envisaged. While both metal layers 22, 24 can be deposited inside and outside the shell 10 as well as directly below the shell, the lower layer 22 may be principally relied upon for electrical signal conduction.

In order to provide a satisfactory vacuum seal between the shell 10 and the substrate 12, electrostatic or anodic bonding is used to form a seal between the silicon of the shell 10 and the glass of the substrate 12 and to form a eutectic between the shell 10 and the top metal layer 24 of the multi-metal leads 16 extending thereunder. The temperature of the substrate is raised, typically over 250° C., and a large voltage, typically over 100V, is applied across the silicon-glass interface. The high temperature and voltage cause the gold of the top metal layer 24 to diffuse into the silicon or polysilicon of the shell 10 at the same time the glass substrate 12 and the silicon shell 10 are bonding to form a vacuum-tight seal. Although the leads 16 are shorted to the same material (i.e. the shell), the intrinsic silicon or polysilicon has a sufficiently high resistance per unit volume (on the order of several GΩ/sq so that the leads remain electrically isolated. Note that electrostatic bonding is hermetic, irreversible, and does not require the use of materials that would otherwise outgas over time.

Figure 4:
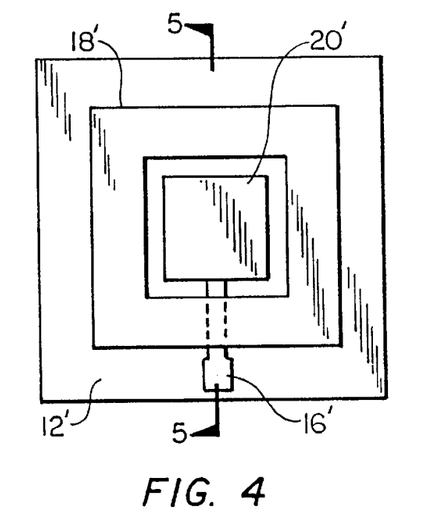
FIG. 4 is a top view of an on-chip vacuum package according to the present invention.

FIG. 4 illustrates a top view of a substrate 12' as employed in another embodiment of the present invention. Here, the substrate 12' is also formed of glass, such as PYREX™ or quartz. Once again, the device 20' in FIG. 4 is representative of a large class of micromechanical devices which can be disposed within the presently disclosed vacuum enclosure. Similarly, the illustrated lead 16' represents one or more leads 16' which connect the device(s) 20' within the enclosure to external devices.

Figure 5:
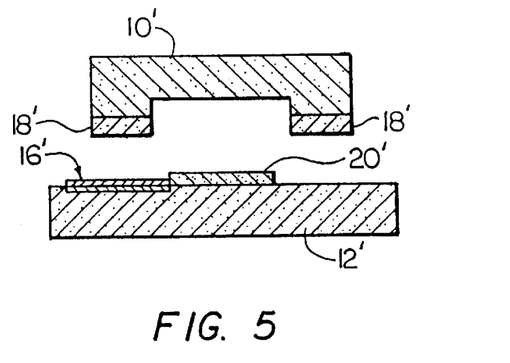
FIG. 5 is a cross-sectional side view of the on-chip vacuum package of FIG. 4 taken along lines 5—5.

The difference between the enclosure of FIGS. 4 and 5 and that of FIGS. 1 and 2 lie in the material of which the shells 10, 10' are made. As discussed, the shell 10 of FIG. 1 is formed of intrinsic silicon or polysilicon, thus enabling the eutectic bonding of the shell 10 directly onto the multi-metal leads 16 and the glass substrate 12. However, in FIGS. 4 and 5, the shell 10' is formed of glass as well, thus necessitating the use of an intermediate material to form a vacuum-tight seal since a glass-glass junction does not provide the desired seal.

FIGS. 4 and 5 illustrate the use of an intermediate adhesion layer 18'. One class of materials which can be employed as the adhesion layer 18' is polysilicon or deposited intrinsic silicon. As noted above, these materials provide sufficient electrical resistance to avoid shorting out the underlying conductive leads 16'. Low temperature chemical vapor deposition (CVD) or sputtering are suitable techniques for the formation of the adhesion layer 181 on the underside of the glass shell 10' prior to the placement of the shell 10' on the substrate 12'. Alternatively, the adhesion layer is formed directly on the substrate.

Figure 6:
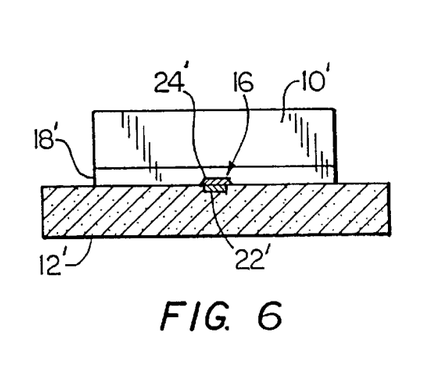
FIG. 6 is cross-sectional side view of the on-chip vacuum package FIG. 4 taken along lines 6—6.

Next, the shell 10' and adhesion layer 18' are aligned with the substrate 12' and placed thereon. Electrostatic or anodic bonding, as described above with respect to FIGS. 1 through 3, is also employed in the present embodiment. Multi-metal leads 16' similar to those described above may also be used in the present embodiment, wherein the upper softer metal 24' diffuses into the adhesion layer 18', as shown in FIG. 6.

Figure 7:
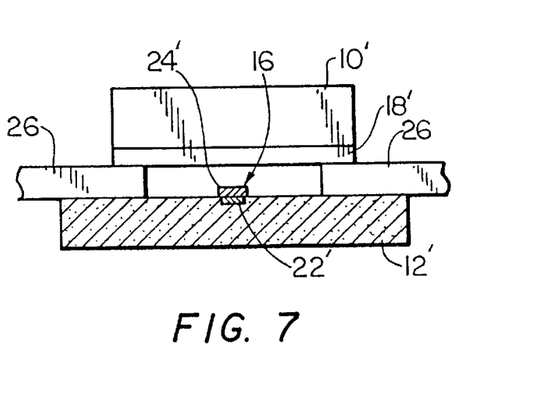
FIG. 7 is the cross-sectional view of FIG. 6 illustrating the use of flags.

In order to achieve the desired vacuum seal, the enclosure must first be outgassed. The substrate 12, 12' and the shell 10, 10' (including the adhesion layer 18' in the latter embodiment) are initially separated by spacers 26, also referred to herein as flags 26. The chamber in which the enclosure is being fabricated is backfilled with an inert gas, such as nitrogen, helium, argon, neon or xenon, to remove the moisture from the chamber, and in particular from the enclosure. The substrate 12, 12' is then heated to the appropriate temperature for anodic bonding, the chamber is brought under vacuum, and anodic bonding conditions are initiated to use the resulting electrostatic conditions to fully outgas materials that would otherwise adversely effect bonding from the enclosure. Bonding does not actually take place since the flags prevent the surfaces from touching. After this outgassing cycle, the flags are removed and bonding can take place as described above. Note that the shell can be filled with an inert gas such as those listed above at any of a large range of pressures immediately prior to anodic bonding.

Figure 8:
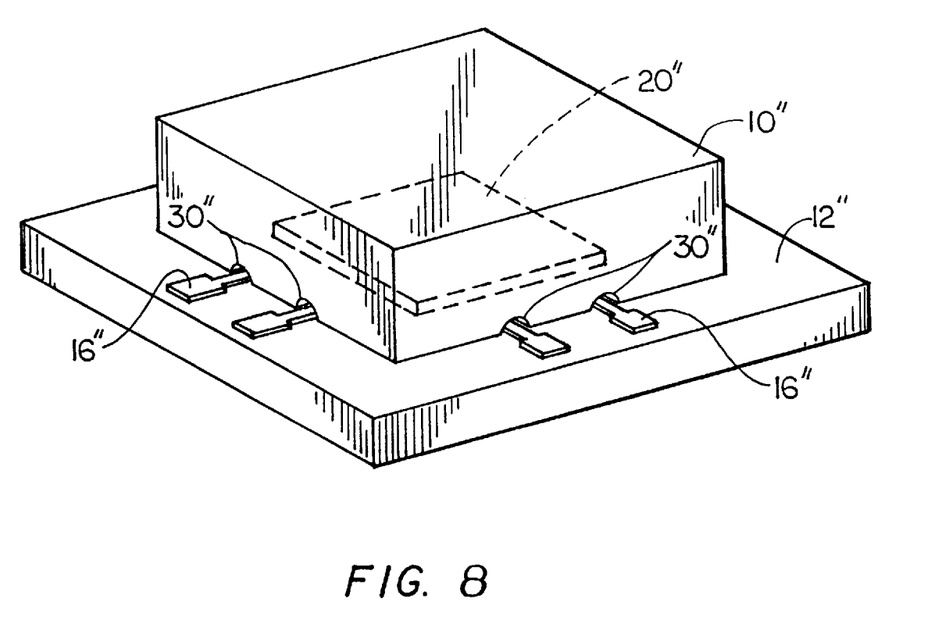
FIG. 8 is a perspective view of an on-chip vacuum package according to the present invention disposed on a substrate.

In FIG. 8, another enclosure according to the present invention is illustrated. Specifically, a shell 10" of either glass or silicon is provided for enclosing at least one device 20" which has been formed on a silicon substrate 12". This shell 10" has one tunnel or port 30" formed in a lower edge thereof for each electrical lead 16" formed on the underlying substrate 12". Thus, when the shell 10" is properly aligned on the substrate 12", there is no direct contact between the electrical leads 16", and the shell 10". An embodiment employing a silicon shell 10" avoids the potential of parasitic capacitance developing between the leads 16" and a silicon or polysilicon shell 10", and further allows a silicon shell 10" to be bonded directly to a glass substrate 12" without the need for an adhesion layer. An embodiment employing a glass shell 10" requires the use of an adhesion layer 18" as described previously. Both of these embodiments requires a further sealing layer 14" in order to maintain a vacuum within the enclosure defined by the shell 10" and the substrate 12".

Figure 9:
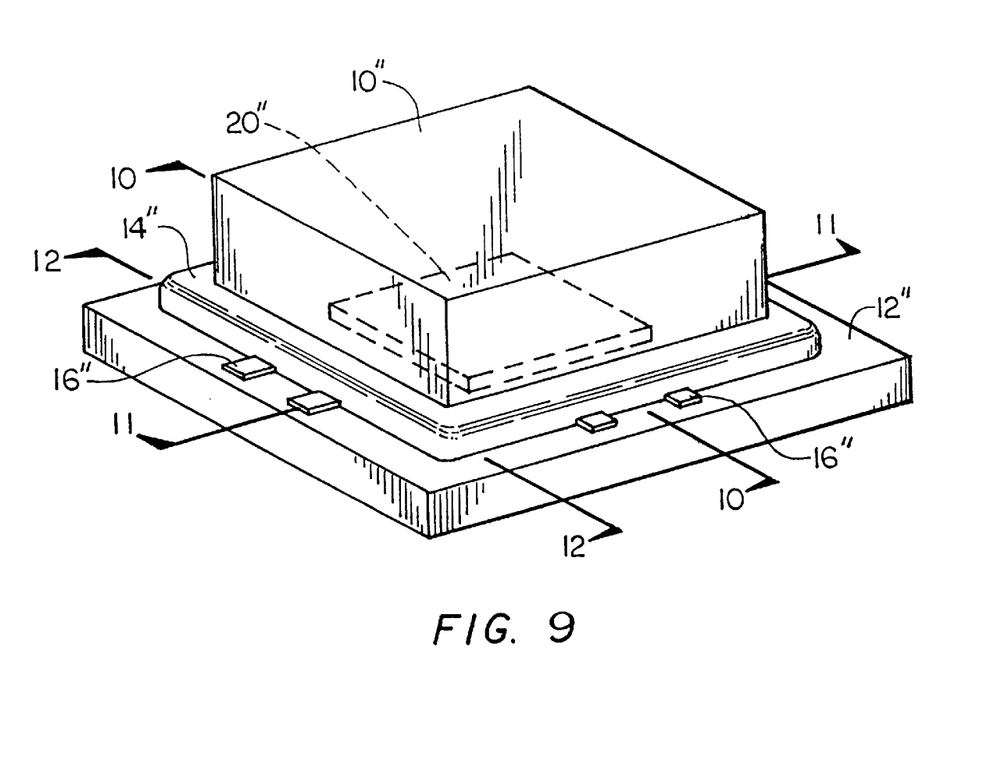
FIG. 9 is the perspective view of the on-chip vacuum package of FIG. 8 including sealing material selectively disposed on the substrate.

Sealing material 14" representing this further layer is evident in FIG. 9 around the lower perimeter of the shell 10". As discussed subsequently, the sealing material 14" encloses the tunnels or ports 30" through which electrically conductive leads 16" pass. These leads 16" are typically connected to the micromechanical or other semiconductor device 20" within the enclosure and to other circuitry (not illustrated) disposed on the substrate 12". The leads 16" can also be connected to pins (not illustrated) which extend from the substrate 12" for interconnection with other substrates and circuitry.

Figure 10:
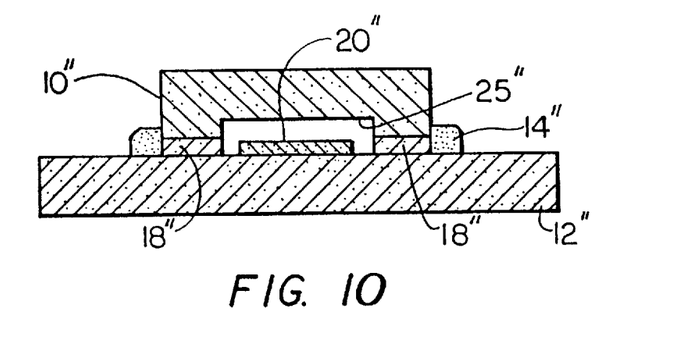
FIG. 10 is a cross-sectional side view of the on-chip vacuum package of FIG. 9 taken along lines 10—10.

In the cut-away view of FIG. 10, the micromechanical device 20" such as a gyroscope or accelerometer is shown formed on the substrate 12". This device 20" and the electrically conductive leads 16" are formed according to known batch fabrication techniques on the substrate 12".

In order to enable shell 10" to substrate 12" bonding in the case where the shell 10" and substrate 12" are of the same material (i.e. glass), the present invention provides a thin interface or adhesion layer 18" which is formed on the underside of the shell 10", as discussed with respect to FIGS. 4 through 6. When in place, the adhesion layer 18" generally surrounds the micromechanical device 20", with the exception of the regions immediately proximate the electrical leads 16", which remain uncovered by the adhesion layer 18". This adhesion layer 18" can be a thin single crystal silicon or polysilicon deposition, or a thin layer of metal such as gold, gold-tin, silicides, or refractory metals.

The shell 10" is represented in the accompanying figures as a box-like structure. However, it is emphasized that this representation is for ease of illustration and is not meant to limit the actual physical characteristics of the shell 10". In general, the shell 10" must have a concave underside 24", also referred to as a recess or void, for accommodating the semiconductor device 20" upon attachment of the shell 10" to the adhesion layer 18".

Once the shell 10" and the adhesion layer 18" have been disposed on and electrostatically attached to the substrate 12", the sealing material 14" is applied at least around the periphery of the shell 10", proximate the adhesion layer 18" (if used) and the substrate 12". The sealing material 14", comprised of a dielectric material such as phosphosilicate glass (PSG), silicon nitride, silicon dioxide or other insulative materials, is also referred to as a dielectric cap. This material 14" can also be applied such that it encases the shell 10". In an alternative embodiment, the sealing layer 14" is metal, representing a less permeable overlayer compared to dielectric.

Figure 11:
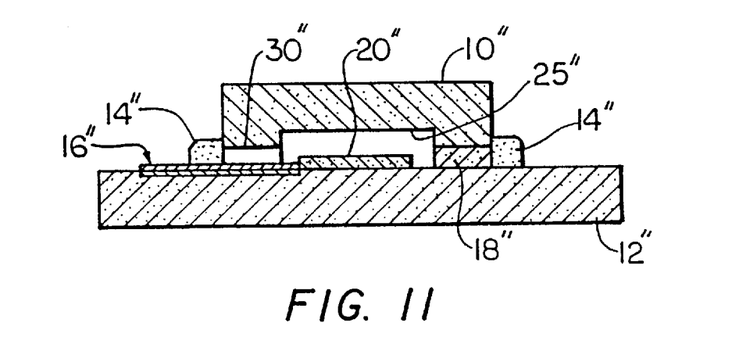
FIG. 11 is a cross-sectional side view of the on-chip vacuum package of FIG. 9 taken along lines 11—11.

Illustrated in FIG. 11 is one of the plurality of ports or tunnels 30" formed in the lower periphery of the shell 10". The port 30" extends from within the shell recess 24" to an outside surface of the shell 10" and is generally co-linear with an electrically conductive lead 16" disposed on the substrate 12".

Figure 12:
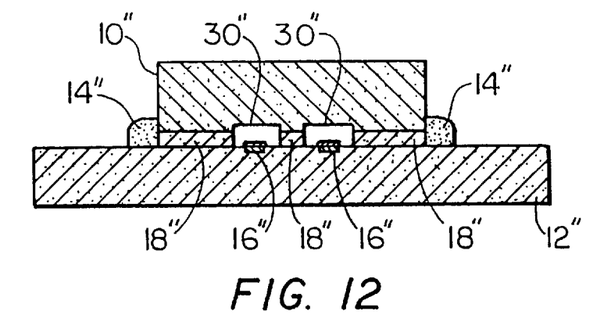
FIG. 12 is a cross-sectional side view of the on-chip vacuum package of FIG. 29 taken along lines 12—12.

FIG. 12 further provides a view of two conductive leads 16" disposed on the substrate 12" and within respective ports 30". The adhesion layer 18" is disposed on the substrate 12" to provide an interface between the shell 10" and the substrate 12". Thus, there is no adhesion layer 18" beneath the shell ports 30" or in communication with the conductive leads 16".

In order to seal the ports 30" and thus the interior of the shell 10" surrounding the device 20", the sealing material 14", which is applied to the shell 10", flows into the ports 30". In addition to providing a gas-tight seal for the interior of the shell 10", the sealing material 14" provides electrical insulation from the effects of capacitive coupling between the conductive leads 16", the shell 10", and the substrate 12".

As noted, the sealing material 14" can also be applied over the entire shell 10", thus providing enhanced insulation from the effects of static charge on the shell 10". If a metal is used as the sealing material 14", an electromagnetic shield is also formed.

Figure 13:
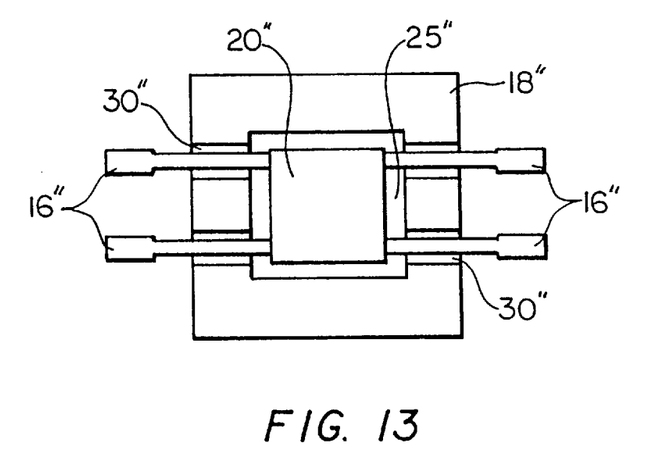
FIG. 13 is a bottom view of the on-chip vacuum package of FIG. 9.

A bottom view of the device 20" disposed on the substrate 12", but not showing the substrate 12", is found in FIG. 13. Four representative electrically conductive leads 16" extend from the device 20". The adhesion material 18" is disposed proximate the device 20", where the shell 10" would otherwise contact the substrate 12". This excludes the regions underlying the ports 30", where the electrically conductive leads 16" are run. Above the device 20" is the shell recess 24". Once the sealing material 14" is applied to this structure, the ports 30" are filled and sealed, and a quantity of sealing material 14" will encircle the adhesion layer 18" and the shell 10".

In an embodiment of the invention which employs an intrinsic silicon shell 10" and thus obviates the need for the adhesion layer 18", the shell 10" would rest directly on the substrate 12" in FIG. 12, and would replace the adhesion layer 18" in FIG. 13.

An on-chip vacuum package according to the present invention and as described with respect to FIGS. 8 through 13 is formed according to the following procedure. A device such as a micromechanical transducer or other structure is formed on a substrate of glass or silicon, including the deposition of electrically conductive leads extending from the device. Next, a shell is provided having a recess or concave region on a lower-most shell surface of dimensions suitable for encasing the underlying device, and further having a plurality of tunnels or ports formed in lower edges of the shell in register with electrical leads disposed on the substrate. If the shell and substrate are of like materials (i.e. both are glass), a thin adhesion layer is then deposited on the shell lower edges, excluding the tunnels or ports. As discussed, the adhesion layer is comprised of single crystal silicon, polysilicon, or metal. The shell is then placed on the substrate and is attached thereto by means such as electrostatic bonding. The adhesion layer does not overlap the conductive leads in a preferred embodiment.

A dielectric capping or sealing material is then applied to the attached shell, at least in the region of the interface between the shell and the substrate and the ports in one embodiment and over the entire enclosure in another. This material is applied by plasma-enhanced chemical vapor deposition (PECVD), sputtering, or any suitable method which promotes the flow of the dielectric material into the ports, thus sealing the electrically conductive leads within the ports. Note that these processes may be carried out in vacuums of, for example, 2 to 250 mTorr, which is in the desired range for optimal micromechanical gyroscope operation.

Finally, it may be necessary to etch through the dielectric sealing material and/or the substrate in order to provide access to electrically conductive pads which are in communication with one or more of the aforementioned leads.

These and other examples of the concept of the invention illustrated above are intended by way of example and the actual scope of the invention is to be determined from the following claims.

What is claimed is:

1. A method for forming a vacuum enclosure enclosing a semiconductor device, said method comprising:

providing a substrate;

disposing a semiconductor device on said substrate;

forming a plurality of electrical leads in communication with said semiconductor device on said substrate, wherein said step of forming further comprises depositing a lower layer of refractory metal on said substrate, and depositing an upper layer of soft metal over said lower layer;

positioning a shell having a concave surface with surrounding edges on said substrate, on said plurality of electrical leads, and over said semiconductor device; and anodically bonding said shell to said substrate, including eutectically sealing said shell edges to said upper layer of each of said plurality of electrical leads.

2. The method according to claim 1, wherein said step of providing a substrate includes providing a glass substrate.

3. The method according to claim 1, wherein said step of disposing said semiconductor device includes fabricating said semiconductor device on said substrate.

4. The method according to claim 1, wherein said step of positioning said shell further comprises positioning a high-resistivity silicon shell.

5. The method according to claim 1, wherein said step of positioning said shell further comprises depositing a high-resistivity silicon layer on said shell lower edge.

6. The method according to claim 5, wherein said step of bonding further comprises eutectically sealing said silicon layer to said plurality of electrical leads.

7. The method according to claim 1, wherein said step of positioning said shell further comprises aligning a plurality of ports disposed in said shell edges with respective ones of said plurality of electrically conductive leads.

8. The method according to claim 7, wherein said step of bonding said shell further includes depositing a dielectric sealing material about said shell edges and within said plurality of ports.

9. The method according to claim 8, further including the step of etching said dielectric sealing material to expose electrically conductive pads proximate said shell.

10. The method according to claim 1, before the step of anodically bonding, further including:

inserting spacers between said shell and said substrate;

backfilling said enclosure with inert gas to evacuate moisture from within said enclosure;

subjecting said enclosure to anodic bonding conditions to electrostatically outgas materials from said enclosure which could adversely effect subsequent bonding; and removing said spacers.

11. A method for forming a vacuum enclosure enclosing a semiconductor device, said method comprising:

providing a substrate;

disposing a semiconductor device on said substrate;

forming a plurality of electrical leads in communication with said semiconductor device on said substrate;

positioning a shell having a concave surface with surrounding edges on said substrate, on said plurality of electrical leads, and over said semiconductor device;

inserting spacers between said shell and said substrate;

backfilling said enclosure with inert gas to evacuate moisture from within said enclosure;

subjecting said enclosure to anodic bonding conditions to electrostatically outgas materials from said enclosure which could adversely effect subsequent bonding;

removing said spacers; and bonding said shell to said substrate.

* * * * *